(12) United States Patent
Rhoads

(10) Patent No.: US 7,166,853 B2
(45) Date of Patent: Jan. 23, 2007

(54) ACTIVE METHOD AND SYSTEM OF ESTABLISHING ELECTRICAL CONTACT

(75) Inventor: Kevin G. Rhoads, Andover, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 1045 days.

(21) Appl. No.: 10/241,307

(22) Filed: Sep. 11, 2002

(65) Prior Publication Data
US 2004/0046539 A1 Mar. 11, 2004

(51) Int. Cl.
*G05F 3/04* (2006.01)

(52) U.S. Cl. ............. 250/492.21; 323/355; 323/305; 118/723 R; 257/357; 257/355; 257/356; 438/212; 438/223

(58) Field of Classification Search .............. None
See application file for complete search history.

(56) References Cited

U.S. PATENT DOCUMENTS

| | | | |
|---|---|---|---|
| 4,120,305 A | 10/1978 | Rhoads et al. | 128/405 |
| 6,062,870 A | 5/2000 | Hopfer, III et al. | 439/66 |
| 6,159,055 A | 12/2000 | Satitpunwaycha et al. | 439/700 |
| 6,219,219 B1 | 4/2001 | Hausmann et al. | 361/234 |
| 6,241,537 B1 | 6/2001 | Tate et al. | 439/108 |
| 6,365,941 B1 * | 4/2002 | Rhee | 257/357 |

* cited by examiner

*Primary Examiner*—Nikita Wells
*Assistant Examiner*—Zia R. Hashmi
(74) *Attorney, Agent, or Firm*—Varian Semiconductor Equipment Associates, Inc

(57) ABSTRACT

A system for electrically contacting a semiconductor wafer during implanting of the wafer includes one or more pairs of closely spaced contacts located adjacent the semiconductor wafer and a driving circuit connected to the contacts to provide a discharge from one contact to the semiconductor wafer and from the semiconductor wafer to the other contact of each pair of contacts. The contacts can be spaced apart from the wafer and the tips of the contacts closest to the wafer may have sharp points to aid in the establishment of corona at lower drive voltages. Alternately, the contacts may be rounded and may contact the wafer. The driving circuit may be adapted from a pulsed discharge circuit, such as a Kettering ignition circuit, a capacitance discharge ignition circuit, or a blocking oscillator circuit. Alternately, the driving circuit may be adapted from a continuous discharge circuit, such as a Tesla coil circuit.

30 Claims, 3 Drawing Sheets

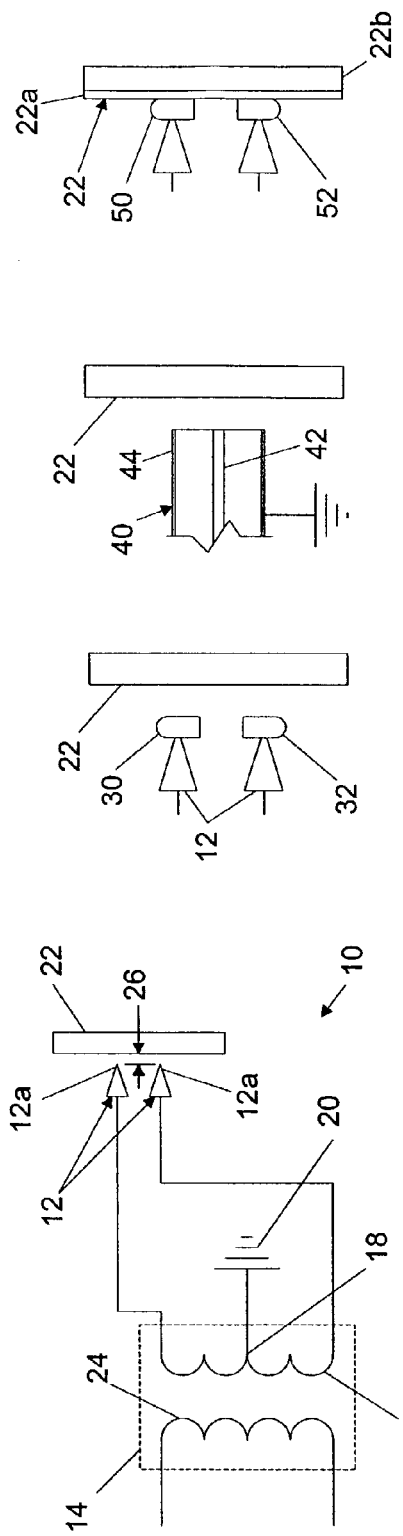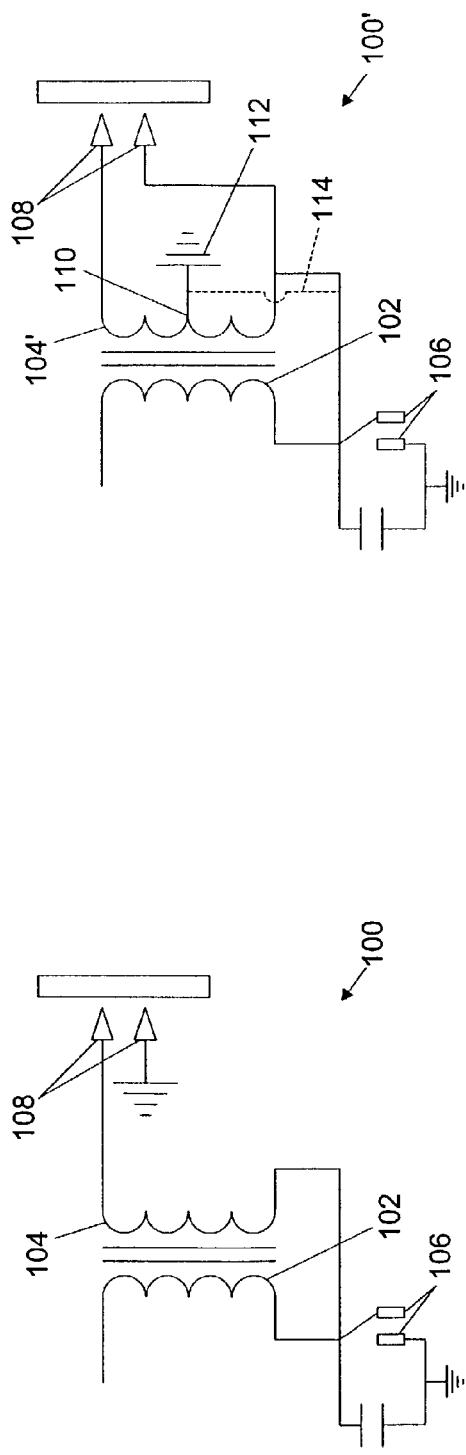

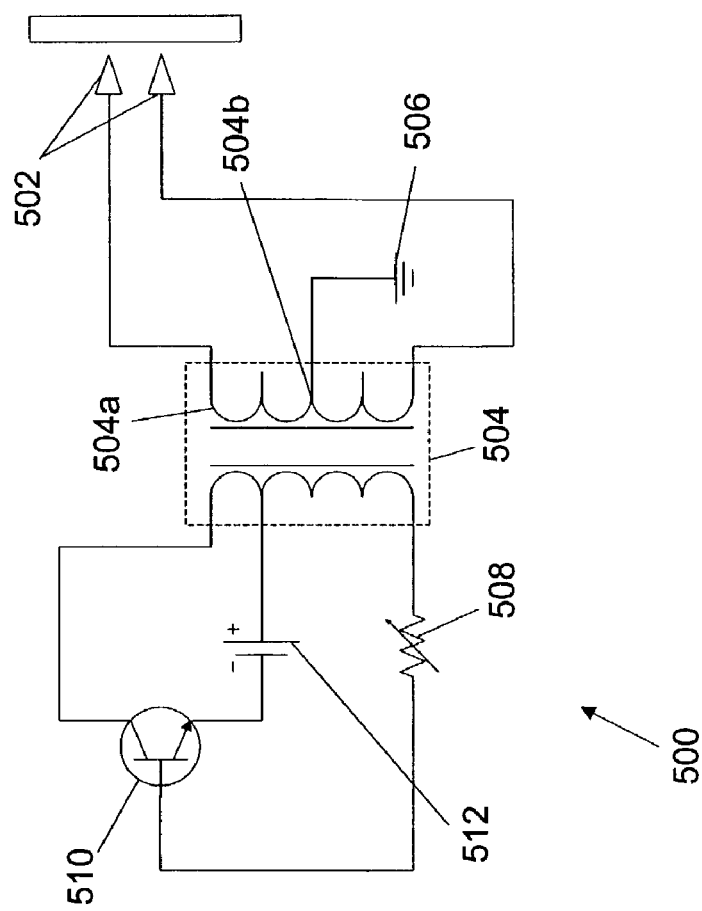
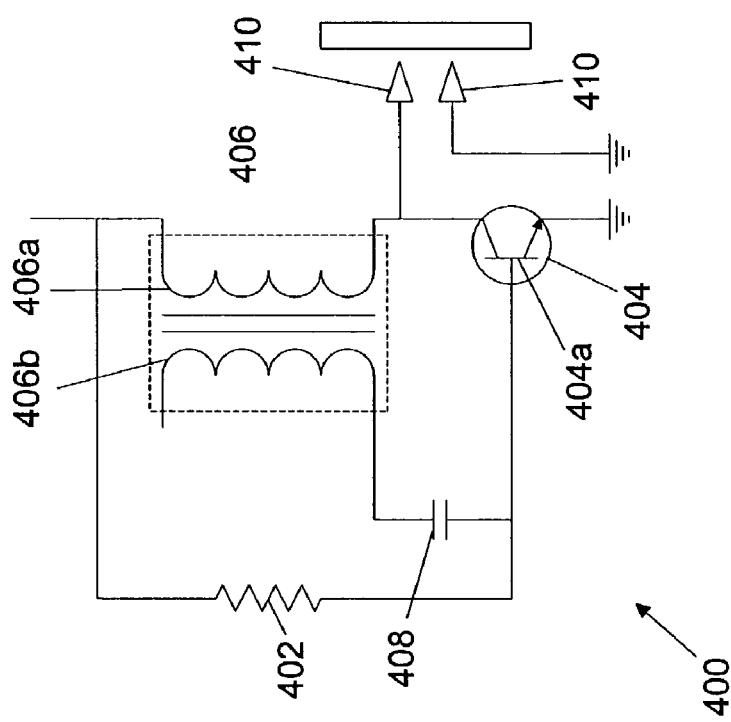
FIG. 8b
FIG. 8a

ACTIVE METHOD AND SYSTEM OF ESTABLISHING ELECTRICAL CONTACT

RELATED APPLICATIONS

There are no related applications.

FIELD

The methods and systems relate to electrical contacts, and more particularly to the use of electrical excitation to create electrical contacts.

BACKGROUND

Making good electrical contact between surfaces that are not permanently bonded may present challenges. As an example, in the semiconductor processing industry, contacts may need to be applied to the silicon wafers for grounding the wafers during the implantation process, for removing beam induced charge during implantation and/or for controlling the potential of the wafer during the implantation process. Similar situations may exist in other industries, e.g., in the design of switches, relays, plugs and sockets. Typical solutions can involve mechanical deformations, e.g., wiping, piercing, scouring and/or polishing, in order to provide clean conductor-to-conductor junctions. Sometimes liquids, gels and/or pastes may be used to enhance the conductance of the contact. As an example, electrode gels may be employed for enhancing contact with EEG (electro-encephalo-graph) and EKG (electro-cardio-graph) electrodes.

In the semiconductor industry, pointed ground pins may be used to contact the wafers. The points can induce surface finish damage and can contribute to backside contamination through the introduction of foreign particles. Also, the impedance of the resulting contacts may not be as low as may be desirable for some applications, such as such as high beam current implantations, pulsed plasma deposition processes or other processes during which maintaining close control of the potential of the wafer may be critical, even as large and/or rapidly changing currents may need to be transferred. These standard approaches to making low-impedance electrical contact to materials can involve methods that may be undesirable or unacceptable for semiconductor processing, such as the use of large contact forces and the use of liquid, paste or gelled electronic or electrolytic conducting materials to improve contact. Also, the use of sharply pointed contact probes may involve at least local damage at the point of contact and the so-called "spreading resistance" can limit the conductance of the contact.

While Ohmic electronic conduction is highly linear, making electrical contact can often involve highly non-linear processes due to surface insulating and semi-insulating layers and the difficulty in establishing a direct metallurgical bond between two conductors that may be brought transiently into contact. For devices such as relays, when mercury-wetted contacts cannot be used, a "wiping" action at the contact points may be useful. Similarly, circuit board sockets can be distinguished by the nature of the contacts made during device insertion, and whether significant "wiping" action may be achieved during insertion. A "wiping" contact may be useful for electrical contacts between two metals as most metals exhibit some degree of ductility, while their surface insulating layers, typically oxides, hydroxides, sulfides and the like, can commonly be of low intrinsic strength and can be easily perturbed, though aluminum oxide layers may be the common exception.

Continuing with reference to the semiconductor industry, it can be known that implantation methods may require adequate electrical or grounding contacts to the wafer. For example, adequate electrical contact may become more central to the implantation process when the pulsed plasma deposition method, referred to as $P^2LAD$, may be used, as the wafer potential can be pulsed to effect the deposition. For $P^2LAD$, improved electrical contact can aid in improving dosimetry of implant. To ensure proper implantation and adequate electrical contact, it may be desirable to improve contact conductance, i.e., lower impedance, reduce or eliminate wafer surface finish damage created by the electrical contacting means and reduce backside particles generated by the grounding means.

However, improvements to electrical contacting or grounding contacts may be subject to various constraints and issues. Typical silicon wafers can have backside oxide layers that may be natural oxide, or sometimes the backside layers may be intentionally grown. In addition, some silicon wafers may have intentionally created insulating layers on the wafer backside, such as silicon oxides, silicon nitrides or exogenous added material layers. Silicon oxides, as well as others of the backside and insulating layers, can typically be hard, adherent and highly insulating, in contrast to the surface oxide layers on many metals. Material compatibility may be a concern in that grounding structures may be a source of material contamination. For $P^2LAD$, it additionally may be desirable to have not merely a low resistance, but also a low impedance (i.e., low inductance as well as low resistance) contact capable of sinking the pulse-deposition currents without significant shift in wafer potential.

SUMMARY

According to the methods and systems described herein, a system for electrically contacting a semiconductor wafer during implanting of the wafer can comprise one or more pairs of closely spaced contacts located adjacent the semiconductor wafer and a driving circuit connected to the contacts to provide a discharge from one contact to the semiconductor wafer and from the semiconductor wafer to the other contact of each pair of contacts. The contacts may have sharp or rounded points, or the contacts may be the inner and outer conductors of a coaxial cable. The contacts may be separated from the semiconductor wafer by a gap distance that is less than the least separation distance between the contacts. In one embodiment, the rounded points of the contacts may contact insulating surface layers on the semiconductor wafer and the discharge may pass through the insulating layer to a conduction inner portion of the semiconductor wafer.

The driving circuit may have a transformer with a balanced secondary with a center tap tied to a chosen potential to be impressed upon the target and the contacts may be driven from the balanced secondary. The circuit may be a Kettering ignition circuit, a capacitive discharge ignition circuit, a Tesla coil circuit, or a blocking oscillator circuit. The Tesla coil circuit may have at least one RF amplifier/oscillator and may have the primary winding, the secondary winding, or both windings resonated. The driving circuit may be gated to correspond the discharge with deposition pulses of a pulsed plasma deposition implantation process such that the leading edges of the deposition pulses trail the corresponding leading edges of the discharge, and the trailing edges of the deposition pulses are coterminous with, or lead the trailing edges of the discharge. The gating may control the driving circuit to provide gating between two discharge types, i.e., between corona discharge, glow discharge, arc discharge and/or spark discharge.

A method of electrically contacting or grounding a semiconductor wafer for implantation of the semiconductor wafer can comprise energizing a circuit to create a discharge between a pair of contacts adjacent an insulating surface layer of the semiconductor wafer. The discharge can result in electrical breakdown of the insulating surface layer to form a conductive pathway from one of the contacts, through the insulating surface layer, to a conductive interior portion of the semiconductor wafer and from the conductive interior portion, through the insulating surface layer, to the other contact. The method may also gate the discharge to correspond the discharge with deposition pulses of a pulsed plasma deposition implantation process and the discharge may be gated between corona discharge, glow discharge, arc discharge and/or spark discharge.

BRIEF DESCRIPTION OF THE DRAWINGS

The following figures depict certain illustrative embodiments of the systems and methods in which like reference numerals refer to like elements. These depicted embodiments are to be understood as illustrative and not as limiting in any way.

FIG. 1 may depict a schematic circuit diagram for providing electrical contact;

FIG. 2 may depict button electrode electrical contacts;

FIG. 3 may depict a coaxial cable electrical contact;

FIG. 4 may depict button electrode electrical contacts in contact with a semiconductor wafer;

FIGS. 5a and 5b may depict schematic Kettering ignition circuit diagrams for providing electrical contact;

FIGS. 8a and 8b may depict schematic blocking oscillator circuit diagrams for providing electrical contact.

DETAILED DESCRIPTION OF THE PREFERRED EMBODIMENT

Figure 7A:
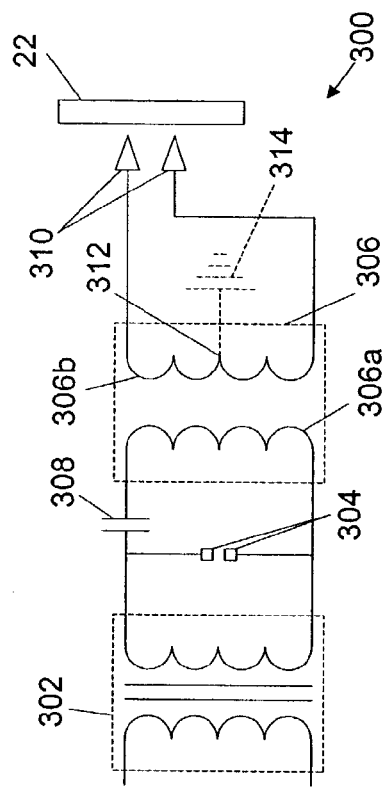
FIGS. 7a and 7b may depict schematic Tesla coil circuit diagrams for providing electrical contact.

Referring now to FIG. 1, there can be shown a partial schematic diagram of a circuit 10 that can provide low impedance electrical contacting, while avoiding or reducing surface finish damage created by the electrical contacting means and reducing the introduction of foreign particles generated by the electrical contacting means. While grounding may be one of the more common purposes for electrical contacting, the devices and methods disclosed herein can be useful for a variety of electrical contacting for a variety of intended purposes. Generally, electrical excitation can be used to electrically bridge from conductor to conductor without necessarily having the conductors mechanically or physically contact one another and/or without necessarily causing permanent damage.

The electrical excitation, or discharge, may be classified as an arc, spark, corona or glow, though the classifications can overlap. The distinguishing features between the classifications may be in the continuity or intermittency of the discharge, e.g., arc vs. spark, in the spatial extent of the discharge, e.g., arc vs. corona, or in the degree of the discharge in some sense, e.g., arc intensity vs. glow intensity. Electric arcs may be long lasting, high power discharges that can provide very low impedance paths. A spark may be a short duration, high power discharge also providing a low impedance path. However, both arcs and sparks can involve the volatilization of electrode material. Glow discharges can provide low impedance paths and, normally, electrode volatilization may not occur during glow. However, cathode sputtering can occur as a result of positive ion bombardment of the cathode. At higher gas pressures, transition from glow to arc can tend to occur more easily. Corona discharge can occur due to field intensification with small radii of curvature, such as may be found at points, corners or on wires. As a corona discharge may not bridge the gap between electrodes, it may not, by itself, suffice to establish a low impedance contact. However, the field intensification can be useful in initiating either glow or arc discharges. Furthermore, corona can provide a source of plasma, which can act as an electrode "wetting" agent similar in function to electrode gel for EKG/EEG applications, which may significantly reduce contact impedance over what would be present for an electrical contact in the absence of corona.

A transient localized electrical breakdown can be induced by use of high voltage, low current excitation. A high frequency excitation, such as may be provided by two contacts used with balanced drive, can offer advantages, though other frequencies and D.C. may be used. However, in the high frequency case, if the balancing of the drive is not perfect, net potential shift may be induced. Also, in the context of the semiconductor industry, high frequency currents in a wafer may tend to surface crowd, i.e., produce a "skin effect" and may be conducted across the wafer's front-sides. When such may be the case, partially completed devices on the wafer can be destroyed and implant non-uniformities can be induced.

To minimize these effects, pointed contacts may be used in close-proximity pairs, as shown by contacts 12 in FIG. 1. Utilizing transformer 14, individual pairs of contacts 12 may be driven from an independent balanced secondary 16 whose center-tap 18 is tied directly to local ground 20. With the contacts 12 being in close proximity pairs, the induced currents can appear to follow a 2-D dipole configuration for radii more than a few tip spacings away. By driving individual pairs of contacts 12 from a balanced transformer secondary 16, with grounded center-tap 18, the degree to which unbalanced drive can occur can be minimized, i.e., the amount of potential shift that the wafer can experience can be minimized. Also, a low-impedance pathway from the wafer 22 to the ground 20 of the center-tap 18 can be created. It can be understood that the center-tap 18, and the center tap of other embodiments as may be described hereafter, may be tied to another potential as may be chosen to be impressed upon the target.

For the circuit 10 of FIG. 1, secondary plasma ignition near the contact 12 sites on the wafer 22 may occur. While this may be a source of backside damage and particles, it may also act in the manner of mercury-wetting of relay contacts or the application of electrode gels on EKG electrodes. This improved contact may make mechanical contact of the contacts 12 to the wafer 22 unnecessary, which may result in lower backside damage and foreign particles. The pairs of contacts 12 can terminate close to but not touching the wafer 22 and the actual electrical contact would be affected by the discharge between the contacts 12 and among the contacts 12 and the wafer 22. It can also be noted that electrical breakdowns need not be destructive, nor induce permanent mechanical or chemical changes in the wafer 22.

As opposed to a standard (i.e., voltage source) supply driving the electrodes, higher impedance may be desirable to aid in limiting current and power. This may seemingly be in tension with the goal of providing a low impedance path from the wafer 22 to ground 20. To a large degree, this may be resolved by separating the frequency at which the discharge operates from the frequencies of interest in electrically contacting or grounding the wafer 22. For example, D.C. grounding may be effected by means of high frequency A.C. discharge and conversely, RF currents can be grounded by means of a low frequency or D.C.-excited discharge. In both cases the electrical contact to the circuit can be low impedance, but the pathways taken in the circuits can be different for differing frequencies. For those frequencies used to establish the discharge, the pathways provided by the driving circuit can be high impedance pathways, while for the frequency ranges to be grounded, the circuit provides low impedance pathways. It can be known in the art to employ such partitionings of currents or other electrical signals by frequency and/or by balanced vs. unbalanced mode in many circuits for similar reasons.

Additionally, in using a transformer-coupled drive scheme, with the electrical contacting connection being established at the center tap 18 of the secondary 16, much of the current limiting can be achieved within the primary circuit. Ground, or other contact related currents that may flow anti-symmetrically through the two halves of the secondary 16 can see minimal flux coupling to the primary 24. In other terms, the impedance of primary 24 can be high, but can be reflected only into the differential mode on the split secondary 16 and not into the common mode of the secondary 16. This drive scheme can have the advantage that by limiting discharge current and power, the discharge may be more likely to avoid producing permanent changes in the back-side oxide layers of wafer 22. This balanced secondary with grounded center tap approach can be used as a modification of many standard circuits in order to increase their desirability in these applications.

For the embodiment of FIG. 1, contacts 12 may operate in a non-contacting mode, i.e., a small gap 26 can be maintained between contacts 12 and wafer 22. In this mode, the tips 12*a* of contacts 12 may have sharp points, such that the field concentration at the tip 12*a* can aid in the establishment of corona at lower drive voltages than would otherwise be possible. Ionization from corona will aid in establishing a low impedance pathway, especially to a conductor whose surface can be electrically "clean". For the illustrative example of wafer 22, with its insulating oxide layers, corona alone may not suffice to achieve target impedances and a localized, transient arc or glow discharge may be required.

For the example P²LAD process previously discussed, corona induced ionization in the P²LAD process gas may not automatically induce internal ionization in the insulating layers of wafer 22. Also with reference to the P²LAD process, the excitation source, e.g., transformer 14, driving the contacts 12 can be gated synchronously with the P²LAD deposition pulses so as to limit backside damage. In a preferred embodiment for the P²LAD process, the leading edges of the P²LAD deposition pulses may trail the leading edges of the excitation of the contacts 12, and the trailing edges of the P²LAD deposition pulses may be coterminous with, or may lead the trailing edges of the excitation of the contacts 12. Additionally, the gating can drive the contacts between one discharge form and another, such as between a glow and an arc, corona, or spark discharge, between a corona and arc or spark discharge, or between an arc and a spark discharge.

To minimize wafer to ground impedance, the discharge can be established from one contact tip 12*a* of a pair of contacts 12 to wafer 22 and from wafer 22 to the other contact tip 12*a* of the pair of contacts 12. To prevent the discharge from being established directly between the contacts 12, the least separation distance between the contacts 12 in a pair of contacts 12 may be kept greater than their separations from the wafer 22. Contact tip geometries other than the sharp points shown for contact tips 12*a* in FIG. 1 may be possible. In one example shown in FIG. 2, a button contact may be split and the portions 30, 32 may be fixed to the pair of contacts 12. In another example, a pair of contacts 12 may be configured in the manner of a coaxial cable 40, shown in cross section in FIG. 3, wherein a central conductor 42 may be driven and the outer conductor 44 may be kept grounded. Since arc discharges can tend to volatize material from electrodes, the contacts can require periodic replacement. Use of refractory metal for the contacts 12, or at least for the contact tips 12*a* may lessen the frequency of replacement. However, it can be noted that even if point-corona may be insufficient to provide a low enough impedance, glow discharge may suffice without requiring arc.

In one embodiment shown in FIG. 4, contacts 12 may in fact come in contact with wafer 22. In this embodiment, the concerns regarding arcing, e.g., pair spacing and volatization, may become less relevant, as transient-ionization may be induced directly in the insulating surface layers or coating 22*a* of wafer 22. In this embodiment, the sharp pointed contacts normally used to pierce the insulating layers 22*a* may be replaced with more rounded tips, such as the button electrode portions 50, 52 shown in FIG. 4 and previously described with relation to FIG. 2. The electrical breakdown of the insulating surface layers 22*a* of wafer 22 resulting from the transient-ionization can provide the insulator-piercing functionality. The rounded tips 50, 52 may be in mechanical contact with the wafer, but may not be in electrical contact with the conductive interior 22*b* of the wafer due to the intervening insulating surface layers 22*a*. Such rounded tips can be advantageous in that they may induce less backside damage and may add less foreign material into the wafer 22.

Thus, the use of a driving circuit, such as circuit 10, can provide a discharge from one contact 12 to a semiconductor wafer 22 and from the semiconductor wafer 22 to another contact 12. The corona, glow, arc or spark discharge can result in the electrical breakdown of the insulating layers 22*a* such that an electrical circuit or conductive pathway can be created through the semiconductor wafer 22. The creation of the conductive pathway provides a method of grounding the semiconductor wafer during implantation of the wafer.

It can be readily understood by those of skill in the art that circuit 10 of FIG. 1 may be merely exemplary of a number of circuits that can produce the required discharge. For example, in a Kettering ignition circuit 100, as shown in FIG. 5*a*, high current can build flux in the common magnetic circuit shared by the primary and secondary coils 102, 104. This current may then be interrupted, as by opening of points 106, to induce a large voltage spike in the secondary, which can induce electrical breakdown across the gap between contact tips 108. In addition to simplicity, circuit 100 may be advantageous in that energy can be limited by internal magnetic storage and isolation of the secondary can be potentially easy. Disadvantages may include a need for high-current switching at the points, difficulties at high repetition rates, the fall off of energy per pulse at higher repetition rates and the non-continuous nature of the discharge causing difficulty in triggering. While the standard Kettering circuit 100 of FIG. 5*a* provides an unbalanced output drive with one side being referred to ground, it is possible to modify the circuit, shown as circuit 100' in FIG. 5*b*, by providing a balanced secondary 104', whose center point 110 is connected to ground with contacts 108 driven from the balanced secondary 104', similar to the circuit 10 of FIG. 1. The center point, or center-tap 110 may be directly connected to ground 112, or by connection through the points 106, as indicated in phantom at 114.

Figure 6:
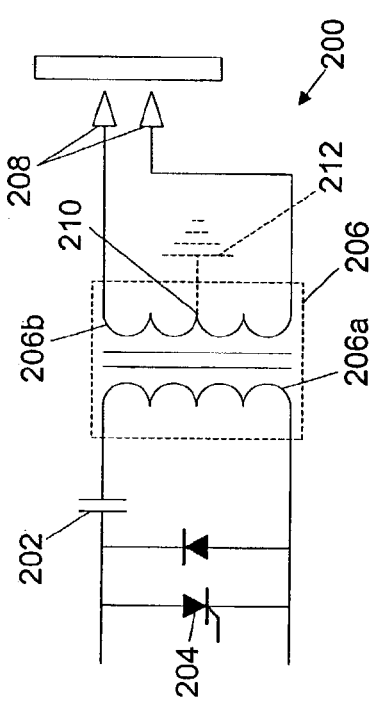
FIG. 6 may depict a schematic capacitance discharge ignition circuit diagram for providing electrical contact.

As another example, a Capacitive Discharge Ignition (CDI) circuit 200, as shown in FIG. 6, may store energy in a primary side capacitor 202, which can be recharged rapidly. Thus, the energy per pulse may not fall off as much with increasing pulse repetition rate as that of the Kettering ignition circuit 100. The CDI style circuit 200 can be advantageous when compared to other circuits described herein for an active grounding system that may be switched on and off rapidly and/or repeatedly. The replacement of the mechanical switching element, i.e., points 106, with an electronic switching element 204 (e.g., SCR, bipolar, or FET elements) may also aid in achieving higher repetition rates and easier triggering.

As in the Kettering ignition circuit 100, the CDI circuit 200 may operate with an ignition-coil-style inductor 206, whose properties may be critical. Element 204 can transfer the energy stored in capacitor 202 to the primary 206a of the ignition coil 206, so as to produce the discharge at the gap between contact tips 208. Though the CDI circuit 200 may be somewhat more complex than the Kettering ignition circuit 100, the transformer secondary 206b can usually be easily isolated. The standard CDI circuit 200, as shown in FIG. 6, can provide an unbalanced output drive with one side being referred to ground. However, the circuit 200 can be modified by providing a balanced secondary 206b, whose center point 210 can be connected to ground 212, as shown in phantom in FIG. 6.

FIG. 7a may show a further exemplary circuit for producing a discharge. Tesla coil circuit 300 can provide repetitively pulse modulated or continuous RF high voltage. For the Tesla coil circuit 300, optional line transformer 302 may uptransform the line voltage to higher voltage. Typically, a spark-gap 304 can be provided in the transformer primary 306a of coil transformer 306, which can break down under the action of applied AC line voltage, providing a rich harmonic source. In addition to the step-up of a large secondary to primary ratio, the coil transformer 306 typically may be resonated. Commonly, a resonating capacitor 308 can be used in the primary circuit, as shown in FIG. 7a. Optionally, the secondary can be resonated instead of or in addition to the primary (not shown).

Spark-gap 304 discharges when capacitor 308 charges to a high enough value, effectively connecting capacitor 308 to the primary coil 306a. The capacitor 308/primary coil 306a circuit may then oscillate (at a frequency much higher than the applied AC frequency) until losses dissipate the energy stored in capacitor 308. The oscillations of the capacitor 308/primary coil 306a circuit can cause the secondary 306b to resonate in sympathy, resulting in discharge at the contact tips 310. While most Tesla coil circuits may be high voltage/high power devices, Tesla coil circuit 300 may be a designed as a lower power circuit for use in grounding the semiconductor wafer 22. As in the previously described circuits, the coil transformer 306 may provide good isolation. Additionally, the output can be continuous, thus avoiding triggering and repetition rate issues. However, the Tesla coil circuit 300 may be somewhat more complex than the Kettering ignition circuit 100 or the CDI circuit 200 and the potential for EMI from the high voltage RF output may exist. As described for the Kettering and CDI circuits 100', 200, the Tesla coil circuit 300 can be modified by providing a balanced secondary 306b, whose center point 312 can be connected to ground 314, as shown in phantom in FIG. 7a. Although the common configurations for Tesla coil circuits, such as circuit 300, typically ground the one side of the secondary 306b, a center-grounded balanced output modification, as shown and described, can generally be made to Tesla-coil types of circuits.

Figure 7B:
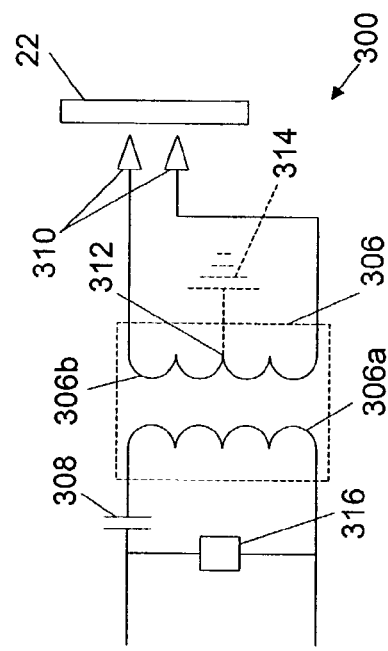

FIG. 7b can show an alternative Tesla coil circuit 300' having RF amplifier/oscillator drivers 316, rather than the spark-gap 304 of Tesla coil 300 shown in FIG. 7a. The use of RF amplifier/oscillator drivers 316 can substantially curtail EMI. Such drivers 316 may be found in high-voltage RF generators that may use a Tesla-coil style resonated step-up transformer. RF generators may provide tighter frequency control and may avoid "spattering" of energy over the band. However, the increased circuit complexity and the need for RF power amplification circuitry may increase costs. It can also be noted that harmonic generation can occur if the discharge switches on and off, such that the severity or lack thereof for EMI issues may be dependent upon the operation of the system. Switched or pulsed operation can increase the amount of off-frequency power generation, without any discernable advantage over continuous operation.

The resonant capacitor 308 of the Tesla coil circuit 300, as well as the Tesla-style RF generators, can be a critical component. Such capacitors may need to be low loss, high-voltage capable and may be subjected to fairly rigorous use. As an alternative, standard RF power amplifiers can be used to drive a non-resonated step-up transformer, providing advantages and disadvantages similar to those for the RF amplifier/oscillator drivers 312, but without the need for a resonating capacitor. However, even with RF power amplifiers, it may not be uncommon to resonate the output transformer.

FIG. 8a may show an additional exemplary circuit in the form of a blocking oscillator circuit 400 that can be readily adaptable to producing low-power high-voltage pulses. When power may be applied to circuit 400 at V, resistor 402 can provide forward bias and transistor 404 can conduct. Current flow through transistor 404 and the primary 406a of transformer 406 can induce a voltage in the secondary 406b. Transformer 406 may be wound to produce a 180° phase shift between primary 406a and secondary 406b. Thus, the bottom side of primary 406a may go negative as the bottom side of secondary 406b may go positive. The positive voltage of secondary 406b can be coupled to the base 404a of transistor 404 through capacitor 408, and transistor 404 may conduct more. This arrangement can provide more collector current and more current through primary 406a through regenerative feedback.

Very rapidly, sufficient voltage can be applied to saturate the base 404a of transistor 404, providing a very steep leading edge for the output pulse at contact tips 410. The voltage remains constant and the capacitor 408 can charge until the primary 406a can become saturated. The capacitor 408 can now discharge through the resistor 402 and cut off transistor 404, ending the pulse. As capacitor 408 discharges, voltage on the base 404a of transistor 404 can gradually return to a forward-bias condition, thus beginning another pulse.

FIG. 8b can show an alternative blocking oscillator circuit 500. Contacts 502 can be connected to balanced secondary 504a of transformer 504, whose center point 504b can be connected to ground 506. The load 508 can provide feedback from the output to the input, and can thus provide negative resistance in the circuit 500 depending on the magnitude of the feedback and gain of the transistor 510 and oscillation can occur. The capacitor 512 can increase the feedback.

The blocking oscillator circuits 400 and 500 can thus provide the necessary discharge with a relatively simple circuit and relatively easy isolation of the output side. However, the pulsed output may be disadvantageous for some applications. Where pulsed output may be used, such as in P$^2$LAD, triggering of the pulse, as by gating means, so as to match the deposition pulses may be available with certain circuit variants. In particular and as previously noted, the CDI circuits 200, 200' may be especially suited to triggered use in that switching element 204 may provide gating of the transformer 206 such that the output pulses, or discharges may correspond with the deposition pulses.

It can be seen from the above exemplary circuits that a choice between triggered (pulsed) and continuous discharge operation can be made. Triggering and repetition rate concerns may favor continuous discharge operation provided output power level can be kept down. For continuous operation the target frequency can be chosen to correspond to one of the designated Industrial, Science, Medical (ISM) frequencies to minimize RFI/EMC compatibility issues. Since P$^2$LAD operation can involve pulsing the wafer potential to control deposition, timing of the chosen circuit and excitation for establishing active connection may require careful consideration of how these timings may relate to one another. It may be known in the art that relative timing, or alternately relative frequency, issues may be trivial when a wide disparity can exist between the two frequencies or time constants. Based on this principle, the time constants of the operation of the active grounding circuit can be set to be much shorter or much longer than the 20 µS to 200 µS pulses of the P$^2$LAD process. While both shorter and longer operation of the chosen circuit may be theoretically feasible, operation of the active grounding circuit at much shorter time scales may likely be problematic unless the generator(s) can be kept extremely close to the point of application of the output.

Additionally, the chosen circuit may have the primary grounded with the secondary floated, or the entire circuit may be floated. Floating the output, i.e., secondary, side, while keeping the primary side at ground level can simplify power supply and control of the circuit, and so may be preferred over floating the circuit. In this case, the transformer may require adequate high voltage insulation and DC isolation between primary and secondary. In addition, the transformer may require wider bandwidth for pulsed operation, or higher frequency capability for continuous RF operation, than may be commonly required in high voltage isolation transformers. Transformers designed for ignition systems can provide wide bandwidth, while transformers for switch-mode power supply applications can provide both wide bandwidth and high frequency capability in the lower RF ranges, e.g., tens to hundreds of kiloHertz.

While the systems and methods have been disclosed in connection with the preferred embodiments shown and described in detail, various modifications and improvements thereon may become readily apparent to those skilled in the art. As an example, the arrangement of the components shown in the figures may be merely for illustrative purposes and can be varied to suit the particular implementation of interest. Additionally, other components may be provided. For example, safety chokes, capacitors and/or spark gaps can be provided to minimize unwanted voltage spikes. As a further example, diodes, resistors, capacitors and other components known in the art may be provided for switching, signal conditioning, timing, etc. Accordingly, items may be combined, expanded, or otherwise reconfigured without departing from the scope of the disclosed embodiments.

The aforementioned embodiments, modifications and changes may also be merely illustrative and not exhaustive, and other modifications and/or changes can be implemented. Accordingly, many additional changes in the details and arrangement of parts, herein described and illustrated, can be made by those skilled in the art. It will thus be understood that the following claims may not to be limited to the embodiments disclosed herein. The claims can include practices otherwise than specifically described and are to be interpreted as broadly as allowed under the law.

What is claimed is:

1. A system for making electrical contact to a semiconductor wafer for implanting of the wafer, comprising:
   at least one pair of closely spaced contacts located adjacent the semiconductor wafer;
   a driving circuit connected to the contacts to provide a discharge from a first contact of each pair of contacts to the semiconductor wafer and from the semiconductor wafer to the other contact of each pair of contacts.

2. The system of claim 1, wherein the contacts terminate in sharp points adjacent the semiconductor wafer.

3. The system of claim 1, wherein the contacts terminate in rounded tips adjacent the semiconductor wafer.

4. The system of claim 3, wherein the contacts contact an insulating surface coating on the semiconductor wafer, the discharge passing through the insulating surface coating to a conductive interior portion of the semiconductor wafer.

5. The system of claim 4, wherein the driving circuit comprises:
   a transformer having a primary winding and a balanced secondary winding, the contacts being driven from the balanced secondary winding; and
   a center tap on the secondary winding, the center tap tied to a chosen potential.

6. The system of claim 5, wherein the driving circuit is gated to correspond the discharge with deposition pulses of a pulsed plasma deposition implantation process.

7. The system of claim 1, wherein the contacts comprise:
   a center conductor of a coaxial cable; and
   an outer, grounded conductor of the coaxial cable.

8. The system of claim 1, wherein a gap distance between the contacts and the semiconductor wafer is less than a least separation distance between the contacts.

9. The system of claim 8, wherein the contacts are fabricated of refractory metal.

10. The system of claim 8, wherein the driving circuit comprises:
    a transformer having a primary winding and a balanced secondary winding, the contacts being driven from the balanced secondary winding; and
    a center tap on the secondary winding, the center tap tied to a chosen potential.

11. The system of claim 10, wherein the driving circuit is gated to correspond the discharge with deposition pulses of a pulsed plasma deposition implantation process.

12. The system of claim 11, wherein the driving circuit is controlled to provide gating between at least two of the discharge types contained in the list including corona discharge, glow discharge, arc discharge and spark discharge.

13. The system of claim 1, wherein the contacts are fabricated of refractory metal.

14. The system of claim 1, wherein the driving circuit comprises:

a transformer having a primary winding and a balanced secondary winding, the contacts being driven from the balanced secondary winding; and a center tap on the secondary winding, the center tap tied to a chosen potential.

15. The system of claim 14, wherein the driving circuit is chosen from a group of circuits including Kettering ignition circuits, capacitive discharge ignition circuits, Tesla coil circuits and blocking oscillator, circuits.

16. The system of claim 15, wherein the driving circuit is a Tesla coil circuit having at least one RF amplifier/oscillator.

17. The system of claim 15, wherein the driving circuit is a Tesla coil circuit having at least one of the primary winding and the secondary winding being resonated.

18. The system of claim 1, wherein the driving circuit is chosen from a group of circuits including Kettering ignition circuits, capacitive discharge ignition circuits, Tesla coil circuits and blocking oscillator circuits.

19. The system of claim 18, wherein the driving circuit is a Tesla coil circuit having at least one RF amplifier/oscillator.

20. The system of claim 18, wherein the driving circuit is a Tesla coil circuit having at least one of the primary winding and the secondary winding being resonated.

21. The system of claim 1, wherein the driving circuit is gated to correspond the discharge with deposition pulses of a pulsed plasma deposition implantation process.

22. The system of claim 21, wherein:
leading edges of the deposition pulses trail corresponding leading edges of the discharge; and
trailing edges of the deposition pulses do not trail corresponding trailing edges of the discharge.

23. The system of claim 22, the driving circuit is controlled to provide gating between at least two of the discharge types contained in the list including corona discharge, glow discharge, arc discharge and spark discharge.

24. A circuit for electrically contacting a semiconductor wafer in conjunction with implantation of the semiconductor wafer by the pulsed plasma deposition method, the circuit comprising:
a transformer having a primary winding and a balanced secondary winding;
a center tap on the secondary winding, the center tap tied to a chosen potential;
a pair of spaced apart contacts being driven from the balanced secondary winding and being located adjacent the semiconductor wafer, the circuit providing a discharge from one contact of the pair of contacts to the semiconductor wafer and from the semiconductor wafer to the other contact of the pair of contacts; and
gating means to correspond the discharge with deposition pulses of the pulsed plasma deposition method.

25. The circuit of claim 24, wherein the gating means controls the discharge between at least two of the discharge types contained in the list including corona discharge, glow discharge, arc discharge and spark discharge.

26. The circuit of claim 24, wherein the circuit is chosen from a group of pulsed discharge circuits including capacitive discharge ignition circuits and blocking oscillator circuits.

27. The system of claim 26, wherein the contacts contact an insulating surface coating on the semiconductor wafer, the discharge passing through the insulating surface coating to a conductive interior portion of the semiconductor wafer.

28. A method of electrically contacting a semiconductor wafer for implantation of the semiconductor wafer, comprising energizing a circuit to create a discharge between a pair of contacts adjacent an insulating surface layer of the semiconductor wafer, wherein the discharge results in electrical breakdown of the insulating surface layer to form a conductive pathway from one of the contacts, through the insulating surface layer, to a conductive interior portion of the semiconductor wafer and from the conductive interior portion, through the insulating surface layer, to the other of the contacts.

29. The method of claim 28, comprising gating the discharge to correspond the discharge with deposition pulses of a pulsed plasma deposition implantation process.

30. The method of claim 29, wherein the gating comprises controlling the discharge to provide gating between at least two of the discharge types contained in the list including corona discharge, glow discharge, arc discharge and spark discharge.

* * * * *